United States Patent [19]

Hosticka et al.

[11] Patent Number: 4,956,613
[45] Date of Patent: Sep. 11, 1990

[54] DIFFERENTIAL AMPLIFIER HAVING EXTERNALLY CONTROLLABLE POWER CONSUMPTION

[75] Inventors: Bedrich Hosticka, Duisburg; Roland Klinke, Dortmund; Hans-Joerg Pfleiderer, Zorneding, all of Fed. Rep. of Germany

[73] Assignee: Siemens Aktiengesellschaft, Berlin and Munich, Fed. Rep. of Germany

[21] Appl. No.: 367,268

[22] Filed: Jun. 16, 1989

[30] Foreign Application Priority Data

Jul. 21, 1988 [DE] Fed. Rep. of Germany ....... 3824832

[51] Int. Cl.[5] .............................................. H05F 3/45
[52] U.S. Cl. ..................................... 330/253; 330/261
[58] Field of Search ................................ 330/253, 261

[56] References Cited

U.S. PATENT DOCUMENTS 4,780,688 10/1988 Groom ................................. 330/261
4,843,341 6/1989 Hosticka et al. ..................... 330/253

OTHER PUBLICATIONS

"Design of MOS VLSI Circuits For Telecommunications", New Jersey (1985) pp. 129, 136.

Primary Examiner—James B. Mullins
Attorney, Agent, or Firm—Hill, Van Santen, Steadman & Simpson

[57] ABSTRACT

A differential amplifier having externally controllable power consumption. Differential amplifiers have a "static-bias" stage for setting the quiescent currents that flow in parallel circuit branches. Two field effect transistors that are connected parallel to one another are in series with an output resistor of this stage, these field effect transistors being driven via a level-converting circuit given the appearance of an input signal to be amplified, such that a voltage boost occurs at the output resistor. This voltage boost leads to a current boost in the differential amplifier. Good driver properties, a distortion-free signal transmission and a low dissipated power are provided by this external control of the two field effect transistors that results from the amplifier inputs.

8 Claims, 1 Drawing Sheet

DIFFERENTIAL AMPLIFIER HAVING EXTERNALLY CONTROLLABLE POWER CONSUMPTION

BACKGROUND OF THE INVENTION

The present invention is directed to a differential amplifier.

A prior art differential amplifier is disclosed in the book "Design of MOS VLSI Circuits for Telecommunications" by Y. Tsividis and P. Antognetti, Prentice Hall, New Jersey (1985), pages 129 through 136, particularly FIG. 5.4. Therein, two additional field effect transistors connected in parallel to a power source and serving as controllable power sources are affected by current-mirroring circuits and by the currents flowing in the parallel circuit branches such that one of the additional field effect transistor supplies an auxiliary current that intensifies the quiescent current of the power source when a fixed voltage value is exceeded by an input signal superimposed on a gate bias. The other, additional field effect transistor supplies an auxiliary current that intensifies the quiescent current of the power source when the fixed voltage value is downwardly transgressed by the superimposed input signal. The current-mirroring circuits are structured such that the low quiescent current is greatly intensified by the signal-dependent appearance of the auxiliary currents. Good driver properties for simultaneous reduction of the dissipated power of the differential amplifier are thus achieved.

One disadvantage of this known amplifier, however, is that instabilities that very frequently lead to a distortion of the output signal appear in the control circuits formed by the parallel circuit branches, the current-mirroring circuits and the controllable power sources. These instabilities appear particularly for supply of an input signal having steeply ascending and descending signal edges, for example a square wave voltage.

An earlier German Patent Application P No. 37 01 791.8 discloses a differential amplifier wherein two field effect transistors connected parallel to the power source and serving as controllable power sources are driven from the circuit input via a level-converting circuit such that the low quiescent current is greatly intensified by an appearance of the auxiliary currents dependent on the input signal. Compared to the former, known differential amplifier, the critical advantage herein is that no control of the additional power sources occurs from the amplifier output side. Rather, a control thereof occurs from the amplifier input side, so that no significant distortions of the output signal appear even for square wave voltages to be transmitted.

SUMMARY OF THE INVENTION

An object of the present invention is to provide a differential amplifier that exhibits good driver properties with low dissipated power due to a signal-dependent boosting of its low quiescent current and wherein a simple generation of the auxiliary, signal, dependent current components superimposed on the quiescent current occurs in comparison to prior art differential amplifiers.

The present invention involves a differential amplifier having first and second parallel circuit branches each of which contains a load element and a field effect transistor, respectively, and having a field effect transistor serving as a current source that is connected via a first circuit node to the first and second parallel circuit branches. A gate terminal of the current source transistor is connected to a bias that defines the quiescent currents flowing in these circuit branches. The present invention is a circuit stage for setting the quiescent currents having an output-side resistor connected to a gate terminal of the field effect transistor serving as the current source. Two additional field effect transistors are connected in series with the output-side resistor. A level-converting circuit has an input connected to gate terminals of the field effect transistors in the parallel circuit branches, that, further, converts the DC part of an input signal to a higher output level that roughly corresponds to the value of the threshold voltage of the two additional field effect transistors and has an output side connected to gate terminals of the two additional field effect transistors.

The circuit stage for setting the quiescent currents is composed of a series circuit of two field effect transistors of different channel types. A gate of one of these field effect transistors is connected to a fixed bias and the other transistor is the output-side resistor, whereby a gate terminal of this other transistor is connected to its source or drain terminal as well as to the gate terminal of the field effect transistor serving as the current source.

The level-converting circuit is composed of a differential amplifier stage that contains two current branches of which each has a series circuit of two field effect transistors of different channel types. A current source transistor of one channel type is connected via a second circuit node to these two current branches. Gate terminals of the field effect transistors of the current branches that correspond to the channel type of the current source transistor form the circuit inputs of the level-converting circuit. The junctions between one of the two field effect transistors of the current branches are the circuit outputs of the level-converting circuit. These other two field effect transistors operate in a triode range, whereas the current source transistor is operated in a saturation range.

An advantage obtainable with the present invention is that the power source generating the quiescent current of the differential amplifier is also simultaneously used for generating the auxiliary power components, whereby the quiescent current drive of this power source merely has to be modified. This modification occurs outside of the actual circuit of the differential amplifier and is thus an external circuit measure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
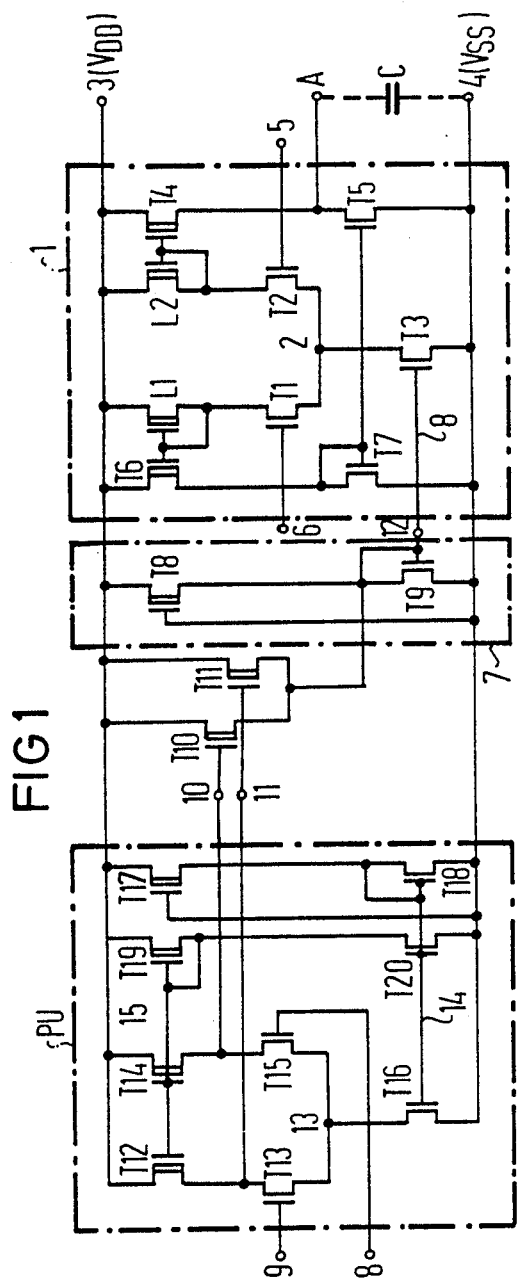
FIG. 1 is a fundamental circuit diagram of a differential amplifier of the present invention.

FIG. 1 shows an embodiment of a differential amplifier within the dot-dash block 1. A circuit node 2 is connected to a terminal 3 that is connected to a supply voltage $V_{DD}$, being connected thereto via two parallel circuit branches whereof one branch contains a series circuit of a load element L1 and of an n-channel field effect transistor T1 and the other branch contains a series circuit of a load element L2 and an n-channel field effect transistor T2. The circuit node 2 is also connected to a terminal 4 that is connected to a reference potential $V_{SS}$, being connected thereto via a further circuit branch that contains an n-channel field effect transistor T3 connected as power source. The load elements L1 and L2 are each composed of a p-channel field effect transistor whose drain terminal is connected to its gate terminal. The series circuit of a p-channel field effect transistor T4 and of an n-channel field effect transistor T5 lies between the terminals 3 and 4, whereby the gate of transistor T4 is connected to the gate of the field effect transistor that forms the load element L2. A further circuit branch that connects the terminals 3 and 4 to one another contains a series circuit of a p-channel field effect transistor T6 and an n-channel field effect transistor T7, whereby the gate of transistor T6 is connected to the gate of the field effect transistor that forms the load element L1. The gate of transistor T7 is connected both to the drain terminal of transistor T7 as well as to the gate of transistor T5. The junction of transistors T4 and T5 is conducted to the output A of the differential amplifier, whereas the gate terminals 5 and 6 of the transistors T2 and T1 respectively represent the positive and the negative amplifier inputs.

A circuit stage 7 sets the quiescent currents, i.e. the currents that flow in the parallel circuit branches L1, T1 and L2, T2 when there is no occurrence of an input signal to be amplified at the inputs 5 and 6. It is composed of a series circuit of a p-channel field effect transistor T8 and an n-channel field effect transistor T9 that is connected between the terminals 3 and 4. The gate of transistor T8 is connected to the terminal 4 ($V_{SS}$), so that a constant current defined by $V_{DD}$ and $V_{SS}$ flows in the series circuit T8, T9. The gate of transistor T9 is connected to the drain terminal of transistor T9, whereby transistor T9 represents the resistor of the circuit stage 7 at the output side. The constant current flowing through transistor T9, this constant bias also being supplied via a line 8 that connects the gate of transistor T9 to the gate of transistor T3 and setting this transistor to a fixed operating point at which it supplies a quiescent current $I_O$. $I_O$ corresponds to the sum of the identical quiescent currents $I_O/2$ that flow through the parallel circuit branches L1, T1 and L2, T2. The gates of transistors T1 and T2 are thereby connected to a bias $U_{G1}$ that is dimensioned such that transistors T1 and T2 are in their conductive state. When the structural designs of the transistors L2 and T4 coincide, then these form a current mirror wherein current $I_O/2$ flows not only through L2 but also through the transistor T4. In an analogous fashion, in the current mirror composed of L1 and T6, for identical structural design of these transistors, the current $I_O/2$ flows not only through L1 but also through transistor T6 and, thus, transistor T7. Finally, the current mirror composed of the identically structured transistors T7 and T5 provides that the current $I_O/2$ flows through transistor T5 just like transistor T7. Currents of the same magnitude in the source-drain paths of transistors T4 and T5, however, mean that no current flows from the output A into a following load circuit that is indicated by a capacitor C.

This quiescent current mode corresponds to a relatively low power consumption. Only when an input signal is to be amplified at the amplifier inputs 5 and 6 is the level control of the transistor T3 intensified to such an extent that the differential amplifier 1 is in a position to supply an optimally undistorted and undelayed output signal to the load circuit connected at terminal A that may have a high impedance under certain circumstances. To this end, a level-converting circuit PU and two p-channel field effect transistors T10 and T11 following thereupon are provided, their source terminals being connected to the terminal 3 and their drain terminals being connected to the drain terminal of T9. Each of the transistors T10 and T11 are in series with the output-side resistor of the circuit stage 7, whereby each of these series circuits connects the terminals 3 and 4 to each other. The inputs of circuit PU are referenced 8 and 9, whereby input 8 is connected to the input 5 of the differential amplifier 1 and input 9 is connected to the input 6 thereof. The upper output 10 of circuit PU is connected to the gate of transistor T10 and the lower output 11 thereof is connected to the gate of transistor T11.

Figure 2:
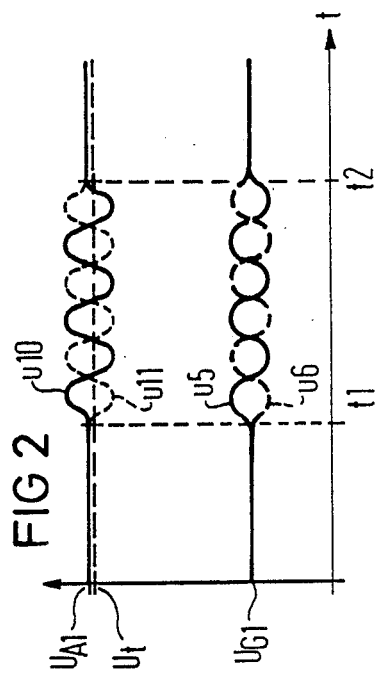
FIG. 2 is a voltage-time diagram for explaining the functioning of the differential amplifier of FIG. 1.

When it is assumed that an input signal u1, for example a sinusoidal input signal u1, is supplied to the amplifier input 5 at point in time t1, this input signal u1 being superimposed on the bias $U_{G1}$, then a resultant signal u5 results at terminal 5 whose time-dependency is indicated in FIG. 2 with a solid line. As a consequence of the inverse level control with u1, a signal u6 appears at the input 6, this signal u6 being identified in FIG. 2 by the broken-line course of the voltage curve. Due to the action of the level-converting circuit PU, voltages that are referenced u10 and u11 in FIG. 2 are obtained at the outputs 10 and 11. In detail, u10 corresponds to a bias value $U_{A1}$ supplied to the gate of transistor T10 on which the input signal u1 amplified in circuit PU is superimposed, whereas u11 is composed of the bias value $U_{A1}$ and of an amplified and inverted input signal u1 that is superimposed thereon. When $U_{A1}$ lies slightly above the threshold voltage $U_t$ of the transistors T10 and T11, as indicated in FIG. 2, then every part of the negative sine half-wave of u11 that falls below $U_t$ switches the transistor T11 into its conductive state, so that a first auxiliary current flows from terminal 3 via transistors T11 and T9 to terminal 4. As a result thereof, the voltage at the terminal 12 rises, this being supplied to the gate of transistor T3, so that the current supplied from transistor T3 to the branches L1, T1 and L2, T2 is also greatly boosted. Analogously thereto, every part of the sine half-waves of u10 that falls below $U_t$ switches the transistor T10 into its conductive state, so that a second auxiliary current flows from terminal 3 via transistors T10 and T9 to terminal 4. This causes the voltage at the terminal 12 to be boosted, so that the current supplied from transistor T3 to the branches L1, T1 and L2, T2 is also greatly boosted in these time spans. During the appearance of the input signal u1 to be amplified, i.e. within the time interval t1 through t2, thus, the current through the parallel circuit branches L1, T1 and L2, T2 controlled via transistor T3 is greatly boosted, so that good driver properties of the differential amplifier are achieved. The higher power consumption of the amplifier caused as a result thereof, however, is limited to the time span in which the input signal u1 occurs.

Since the circuit PU that converts the input level $U_{G1}$ into the output level $U_{A1}$ is driven proceeding from the amplifier inputs 5, 6, no control circuits as in the initially cited, prior art differential amplifier are present, so that the output signal appearing at output A that is taken at the junctions of the transistors L1 and T1 and of the transistors L2 and T2 and that is transmitted to the output A via the current mirrors L2, T4 as well as L1, T6 and T7, T5 is largely free of distortion. The signal transmission to the output thereby proceeds such that every difference in size of the currents following through L2 and L1 that is effected by the level control of T2 and T1 with the input signal u1 yields a corresponding size difference in the currents through T4 and T5 that leads to an output current that can be taken at output A. In the differential amplifier of the present invention, the output signal responds very quickly to fluctuations of the input signal, so that input signals having steeply ascending and descending signal edges, for example square wave voltages, can also be transmitted to the output A largely free of distortion and with a great current boost.

FIG. 1 shows a preferred exemplary embodiment of the level-converting circuit PU within the dot-dash block shown at the left of the figure. The circuit constructed as a differential amplifier stage specifically contains two parallel current branches arranged between a circuit node 13 and the terminal ($V_{DD}$), wherein the first current branch has a p-channel field effect transistor T12 in series with an n-channel field effect transistor T13 and wherein the second current branch has a p-channel field effect transistor T14 in series with an n-channel field effect transistor T15. The circuit node 13 is connected to the terminal ($V_{SS}$), being connected thereto via a circuit branch that contains the source-drain path of an n-channel field effect transistor T16. The input 8 corresponds to the gate terminal of transistor T15 and the input 9 corresponds to the gate terminal of transistor T13. The output 10 is connected to the junction of the transistors T14 and T15 and the output 11 is connected to the junction of the transistors T12 and T13. A circuit branch lying between the terminals 3 and 4 serves the purpose of setting the gate voltage of transistor T16, this circuit branch containing the series circuit of a p-channel field effect transistor T17 and of an n-channel field effect transistor T18. The gate of transistor T17 is connected to the terminal 4, so that a defined current flows through this series circuit, this current being established by the reference potential $V_{SS}$ applied to the gate of T17. The gate of transistor T18 is connected to the drain terminal thereof. The voltage drop which occurs is supplied to the gate of transistor T16 via a line 14. A second circuit branch lying between terminals 3 and 4 that contains the series circuit of a p-channel field effect transistor T19 and an n-channel field effect transistor T20 sets the gate voltages of transistors T12 and T14. A current that is defined by the transistor T20 receiving the same gate voltage as transistor T16 flows in this circuit branch. Transistor T19 is connected as a load element because the gate terminal thereof is connected to its drain terminal. The voltage drop at the drain terminal of transistor T19 is supplied to the transistors T12 and T14 as gate voltages via a line 15. The structural dimensions of the transistors T12 and T4 must be identical to one another and must differ to such an extent from the structural dimensions of the transistor T16 that transistors T12 and T14 operate in the triode region, i.e. in the ascending part of their $I_D/U_{DS}$ characteristic, whereas transistor T16 is operated in saturation. This condition can be satisfied in that the sum of the saturation currents of transistors T12 and T14 is selected larger than the saturation current of transistor T16. The structural dimensions of transistors T12 and T14, further, are selected such that the signal $U_{A1}$ appears at the outputs 10 and 11 when an input signal u1 is not supplied. In addition to the case set forth above wherein $U_{A1}$ slightly exceeds the value of the threshold voltage $U_t$ of transistors T10 and T11, the level $U_{A1}$ can also be selected such that it exactly corresponds to the value of $U_t$ or falls slightly below it.

It also lies within the frame work of the present invention to interchange the channel types of the field effect transistors used with one another and to simultaneously replace the polarities of the supplied voltages with those having the opposite polarities. The voltage values of $U_{A1}$ and $U_{G1}$ are thereby then also to be interchanged with one another, this meaning in FIG. 2 that the voltage curves u5 and u6 take the place of the voltage curves u10 and u11 and vice versa. In this case, circuit PU converts a higher input level $U_{G1}$, i.e. the DC part of the input signal u1, to a lower output level $U_{A1}$. $U_{A1}$ then preferably lies slightly below the value of the threshold voltage $U_t$ of the transistors T10 and T11 that are of the n-channel type. The value of the output level $U_{A1}$, however, can also be selected such that it exactly corresponds to the threshold voltage $U_t$ of transistors T10 and T11 or slightly exceeds it.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A differential amplifier having first and second parallel circuit branches each of which contains a load element (L1, L2) and a field effect transistor (T1, T2), respectively, and having a field effect transistor (T3) serving as a current source that is connected via a first circuit node to the first and second parallel circuit branches (L1, T1; L2, T2) and whose gate terminal is connected to a bias that defines the quiescent currents flowing in these circuit branches, comprising a circuit stage for setting the quiescent currents having an output-side resistor connected to a gate terminal of the field effect transistor (T3) serving as the current source; two additional field effect transistors (T10, T11) of a p-channel type connected in series with the output-side resistor; and a level-converting circuit having an input connected to gate terminals of the field effect transistors (T1, T2) in the parallel circuit branches, that, further, converts the DC part of an input signal to a higher output level that roughly corresponds to the value of the threshold voltage of the two additional field effect transistors (T10, T11) and that has an output side connected to gate terminals of the two additional field effect transistors (T10, T11).

2. The differential amplifier according to claim 1, wherein the circuit stage for setting the quiescent currents is composed of a series circuit of two field effect transistors (T8, T9) of different channel types; wherein a gate of one of these field effect transistors (T8) is connected to a fixed bias and wherein the other transistor (T9) is the output-side resistor, whereby a gate terminal of the other transistor (T9) is connected to one of its other terminals, such other terminals of the other transistor (T9) being a source terminal and a drain terminal, as well as to the gate terminal of the field effect transistor (T3) serving as the current source.

3. The differential amplifier according to claim 1, wherein the level-converting circuit is composed of a differential amplifier stage that contains two current branches of which each has a series circuit of two field effect transistors (T12, T13, and T14, T15, respectively) of different channel types; wherein a current source transistor (T16) of one channel type is connected via a second circuit node to these two current branches; wherein gate terminals of the field effect transistors (T13, T15) of the current branches that correspond to the channel type of the current source transistor (T16) form the circuit inputs (9, 8) of the level-converting circuit; wherein the junctions between the field effect transistors (T13, T15) and the other two field effect transistors (T12, T14) of the current branches are the circuit outputs (10, 11) of the level-converting circuit; and wherein these other two field effect transistors (T12, T14) operate in a triode range, whereas the current source transistor (T16) is operated in a saturation range.

4. A differential amplifier having first and second parallel circuit branches each of which contains a load element (L1, L2) and a field effect transistor (T1, T2), respectively and having a field effect transistor (T3) serving as a current source that is connected via a first circuit node to the first and second parallel circuit branches (L1, T1; L2, T2) and whose gate terminal is connected to a bias that defines the quiescent currents flowing in these circuit branches, comprising a circuit stage for setting the quiescent currents having an output-side resistor connected to a gate terminal of the field effect transistor (T3) serving as the current source; two additional field effect transistors (T10, T11) of an n-channel type connected in series with the output-side resistor; and a level-converting circuit having an input connected to gate terminals of the field effect transistors (T1, T2) in the parallel circuit branches, that, further, converts the DC part of an input signal to a lower output level that roughly corresponds to the value of the threshold voltage of the two additional field effect transistors (T10, T11) and that has an output side connected to gate terminals of the two additional field effect transistors (T10, T11).

5. The differential amplifier according to claim 4, wherein the circuit stage for setting the quiescent currents is composed of a series circuit of two field effect transistors (T8, T9) of different channel types; wherein a gate of one of these field effect transistors (T8) is connected to a fixed bias and wherein the other transistor (T9) is the output-side resistor, whereby a gate terminal of the other transistor (T9) is connected to one of its other terminals, such other terminals of the other transistor (T9) being a source terminal and a drain terminal, as well as to the gate terminal of the field effect transistor (T3) serving as the current source.

6. The differential amplifier according to claim 4, wherein the level-converting circuit is composed of a differential amplifier stage that contains two current branches of which each has a series circuit of two field effect transistors (T12, T13, and T14, T15, respectively) of different channel types; wherein a current source transistor (T16) of one channel type is connected via a second circuit node to these two current branches; wherein gate terminals of the field effect transistors (T13, T15) of the current branches that correspond to the channel type of the current source transistor (T16) form the circuit inputs (9, 8) of the level-converting circuit; wherein the junctions between the field effect transistors (T13, T15) and the other two field effect transistors (T12, T14) of the current branches are the circuit outputs (10, 11) of the level-converting circuit; and wherein these other two field effect transistors (T12, T14) operate in a triode range, whereas the current source transistor (T16) is operated in a saturation range.

7. A differential amplifier having first and second parallel circuit branches each of which contains a load element (L1, L2), the load elements L1 and L2 being p-channel field effect transistors, and an n-channel field effect transistor (T1, T2), respectively, and having an n-channel field effect transistor (T3) serving as a current source that is connected via a first circuit node to the first and second parallel circuit branches (L1, T1; L2, T2) and whose gate terminal is connected to a bias that defines the quiescent currents flowing in these circuit branches, comprising:

a circuit stage for setting the quiescent currents having an output-side resistor, the output-side resistor being an n-channel field effect transistor (T9), connected to a gate terminal of the field effect transistor (T3) serving as the current source; two additional p-channel field effect transistors (T10, T11) connected in series with the output-side resistor; and a level-converting circuit having an input connected to gate terminals of the field effect transistors (T1, T2) in the parallel circuit branches, that, further, converts the DC part of an input signal to a higher output level that roughly corresponds to the value of the threshold voltage of the two additional field effect transistors (T10, T11) and that has an output side connected to gate terminals of the two additional field effect transistors (T10, T11);

the circuit stage for setting the quiescent currents being composed of a series circuit of a p-channel field effect transistor (T8) and the n-channel field effect transistor (T9); wherein a gate of the p-channel field effect transistor (T8) is connected to a fixed bias, whereby a gate terminal of the n-channel field effect transistor (T9) is connected to one of its other terminals, such other terminals of the n-channel field effect transistor (T9) being a source terminal and a drain terminal, as well as to the gate terminal of the field effect transistor (T3) serving as the current source; and the level-converting circuit being composed of a differential amplifier stage that contains two current branches of which each has a series circuit of two field effect transistors (T12, T13, and T14, T15, respectively), transistors T12 and T14 being p-channel field effect transistors and transistors T13 and T15 being n-channel field effect transistors, wherein a current source n-channel field effect transistor (T16) is connected via a second circuit node to these two current branches; wherein gate terminals of the field effect transistors (T13, T15) of the current branches that correspond to the channel type of the current source transistor (T16) form the circuit inputs (9, 8) of the level-converting circuit; wherein the junctions between the field effect transistors (T13, T15) and the other two field effect transistors (T12, T14) of the current branches are the circuit outputs (10, 11) of the level-converting circuit; and wherein these other two field effect transistors (T12, T14) operate in a triode range, whereas the current source transistor (T16) is operated in a saturation range.

8. A differential amplifier having first and second parallel circuit branches each of which contains a load element (L1, L2), the load elements L1 and L2 being n-channel field effect transistors, and a p-channel field effect transistor (T1, T2), respectively, and having a p-channel field effect transistor (T3) serving as a current source that is connected via a first circuit node to the first and second parallel circuit branches (L1, T1; L2, T2) and whose gate terminal is connected to a bias that defines the quiescent currents flowing in these circuit branches, comprising:

a circuit stage for setting the quiescent currents having an output-side resistor, the output-side resistor being a p-channel field effect transistor (T9), connected to a gate terminal of the field effect transistor (T3) serving as the current source; two additional n-channel field effect transistors (T10, T11) connected in series with the output-side resistor; and a level-converting circuit having an input connected to gate terminals of the field effect transistors (T1, T2) in the parallel circuit branches, that, further, converts the DC part of an input signal to a lower output level that roughly corresponds to the value of the threshold voltage of the two additional field effect transistors (T10, T11) and that has an output side connected to gate terminals of the two additional field effect transistors (T10, T11);

the circuit stage for setting the quiescent currents being composed of a series circuit of an n-channel field effect transistor (T8) and the p-channel field effect transistor (T9); wherein a gate of the n-channel field effect transistor (T8) is connected to a fixed bias, whereby a gate terminal of the p-channel field effect transistor (T9) is connected to one of its other terminals, such other terminals of the p-channel field effect transistor (T9) being a source terminal and a drain terminal, as well as to the gate terminal of the field effect transistor (T3) serving as the current source; and the level-converting circuit being composed of a differential amplifier stage that contains two current branches of which each has a series circuit of two field effect transistors (T12, T13, and T14, T15, respectively), transistor T12 and T14 being n-channel field effect transistors and transistors T13 and T15 being p-channel field effect transistors, wherein a current source p-channel field effect transistor (T16) is connected via a second circuit node to these two current branches; wherein gate terminals of the field effect transistors (T13, T15) of the current branches that correspond to the channel type of the current source transistor (T16) form the circuit inputs (9, 8) of the level-converting circuit; wherein the junctions between the field effect transistors (T13, T15) and the other two field effect transistors (T12, T14) of the current branches are the circuit outputs (10, 11) of the level-converting circuit; and wherein these other two field effect transistors (T12, T14) operate in a triode range, whereas the current source transistor (T16) is operated in a saturation range.

* * * * *